(12) United States Patent
Yin et al.

(10) Patent No.: US 10,424,588 B2
(45) Date of Patent: Sep. 24, 2019

(54) CUTTING METAL GATES IN FIN FIELD EFFECT TRANSISTORS

(71) Applicant: Taiwan Semiconductor Manufacturing Co., Ltd., Hsin-Chu (TW)

(72) Inventors: Li-Wei Yin, Hsinchu (TW); Shu-Yuan Ku, Hsinchu (TW); Chun-Fai Cheng, Tin Shui Wai (HK)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/808,618

(22) Filed: Nov. 9, 2017

(65) Prior Publication Data

US 2019/0139969 A1    May 9, 2019

(51) Int. Cl.
| | |
|---|---|
| *H01L 21/8238* | (2006.01) |
| *H01L 29/66* | (2006.01) |
| *H01L 27/092* | (2006.01) |
| *H01L 27/11* | (2006.01) |
| *H01L 21/8234* | (2006.01) |
| *H01L 29/40* | (2006.01) |
| *H01L 27/088* | (2006.01) |

(52) U.S. Cl.
CPC .. *H01L 27/1116* (2013.01); *H01L 21/823431* (2013.01); *H01L 21/823481* (2013.01); *H01L 27/1104* (2013.01); *H01L 27/0886* (2013.01); *H01L 29/401* (2013.01); *H01L 29/66545* (2013.01)

(58) Field of Classification Search
CPC .......... H01L 27/0924; H01L 29/66545; H01L 21/823864; H01L 21/823878; H01L 27/0886; H01L 21/823437; H01L 21/823814; H01L 21/823842; H01L 21/823481
See application file for complete search history.

(56) References Cited

U.S. PATENT DOCUMENTS 9,520,482 B1    12/2016  Chang et al.
9,607,901 B2 *   3/2017  Liu ................... H01L 29/66795

* cited by examiner

*Primary Examiner* — Savitri Mulpuri
(74) *Attorney, Agent, or Firm* — Haynes and Boone, LLP

(57) ABSTRACT

A method includes providing metal gate structures in a first and a second region, respectively, of a semiconductor substrate, simultaneously cutting the metal gate structures by a two-step etching process to form a first and a second trench in metal gate structures of the first and the second region, respectively, and filling each trench with an insulating material to form a first and a second gate isolation structure. Each step of the two-step etching process employs different etching chemicals and conditions. The metal gate structures in the first region and the second region differ in gate lengths and composition of gate electrode.

19 Claims, 16 Drawing Sheets

CUTTING METAL GATES IN FIN FIELD EFFECT TRANSISTORS

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, planar transistors have been replaced by three-dimensional fin-like field effect transistors (FinFET), and polysilicon gates have been replaced by metal gates in an effort for improving device performance with decreased feature size. However, there are challenges in implementing metal gates for FinFET. In one example, after the metal gate replaces the polysilicon gate, the metal gate is cut (or etched) for individual transistors. How to efficiently cut the metal gates needs further improvements.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
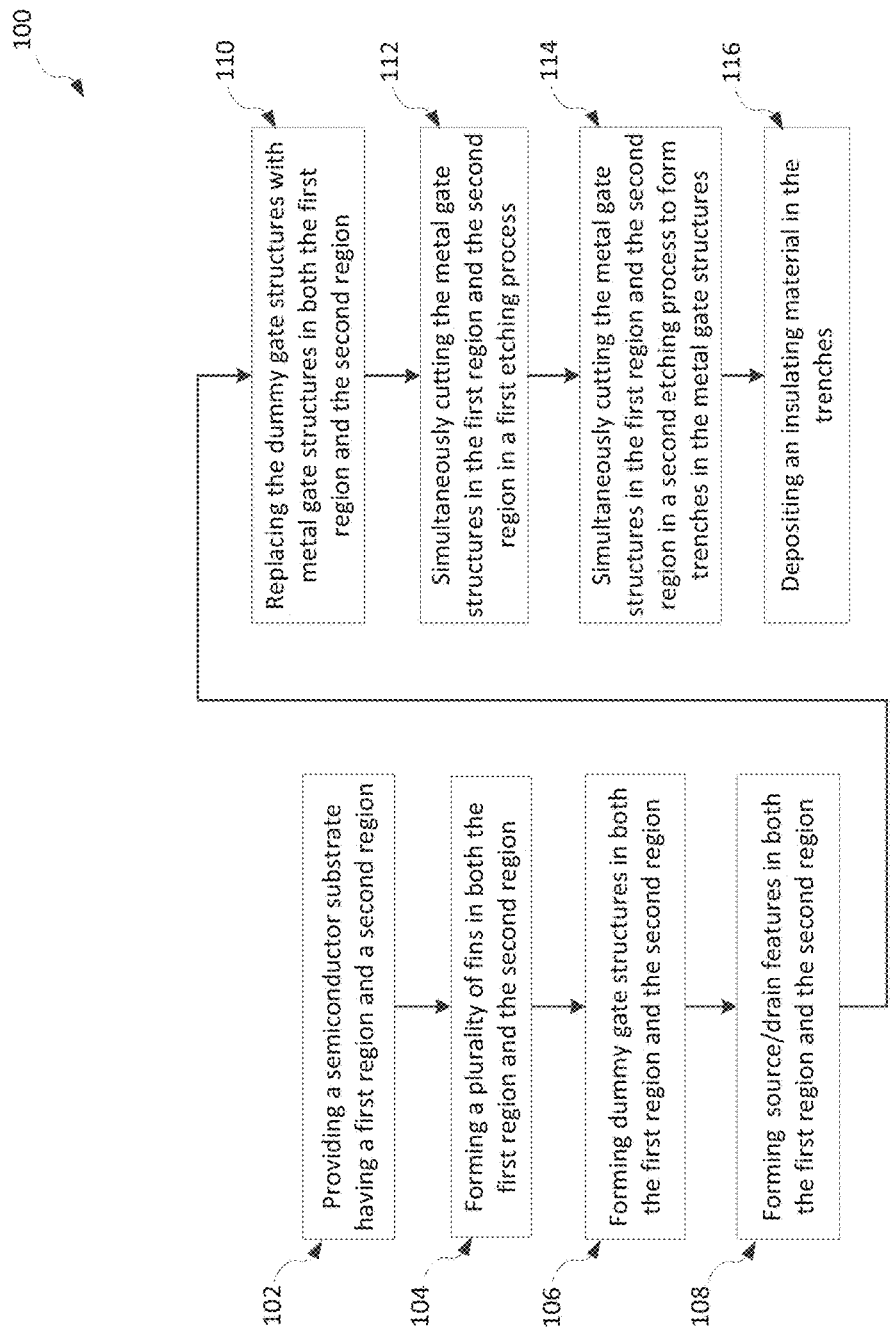
FIG. 1 is a flowchart of an exemplary method for fabricating a fin field effect transistor (FinFET) device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

The present disclosure is generally related to methods for semiconductor device fabrication, and more particularly to methods of cutting metal gate structures, or alternatively referred to as a cut metal gate (CMG) process, in fin-like field effect transistors (FinFETs) that form memory devices and logic devices. The FinFET devices may be, for example, complementary metal-oxide-semiconductor (CMOS) devices comprising a p-type metal-oxide-semiconductor (PMOS) FinFET device and an n-type metal-oxide-semiconductor (NMOS) FinFET device. The following disclosure will continue with a FinFET example to illustrate various embodiments of the present application. Metal gate structures in FinFET devices may include a variety of configurations and compositions depending upon the devices' desired functions (e.g., memory versus logic devices). Fabricating metal gate structures in FinFET devices often entails cutting or shortening the metal gate structures to accommodate further device processing. For metal gates having different gate lengths and multiple different metal layers, implementing a CMG process that can effectively remove all metal layers poses challenges. For example, etch selectivity of a given etchant may vary based on the composition of the metal layers. Further, loading efficiency of the etchant may vary due different gate lengths. Accordingly, the present disclosure contemplates methods of implementing CMG processes by tuning one or more etching parameters employed therein.

Processing steps of method 100 as illustrated in FIG. 1 are described with respect to plane top-view and cross-sectional views of an exemplary FinFET device 200 and its subsequent modifications (e.g., device 400). FIGS. 2A, 3A, 4A, 5A, 6A, 7A, and 8A are plane top-views of the FinFET device, illustrating various components in accordance with embodiments of the present disclosure. FIGS. 2B, 3B, 4B, 5B, 6B, 7B, and 8B are fragmentary cross-sectional views of the FinFET device taken along direction BB' through subsequent processing steps of method 100. FIGS. 2C, 3C, 4C, 5C, 6C, 7C, 7D, and 8C are fragmentary cross-sectional views of the FinFET device taken along direction CC' through subsequent processing steps of method 100.

FIG. 1 is a flowchart of method 100 for fabricating a FinFET device according to some aspects of the present disclosure. It is understood, however, that the application should not be limited to a particular type of device. It is further understood that additional steps can be provided before, during, and after the processing methods provided herein, and some of the steps described can be replaced, eliminated, or moved around for additional embodiments of the present disclosure.

Figure 2A:
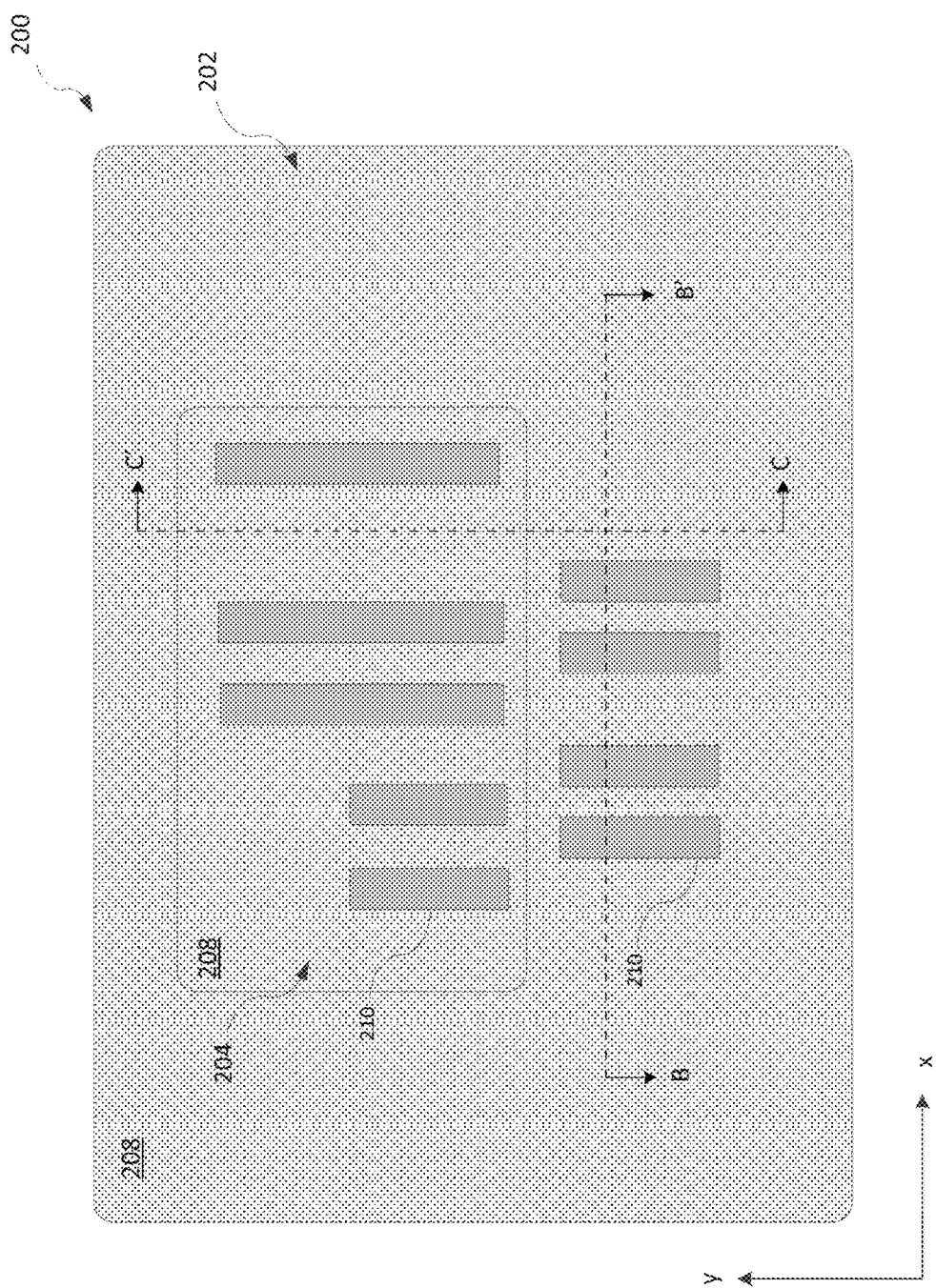
FIGS. 2A, 3A, 4A, 5A, 6A, 7A, and 8A are plane top-views of an exemplary FinFET device at different steps of an exemplary method of fabricating the same according to various aspects of the present disclosure.

Method 100 includes an operation 102, which includes providing a substrate 206 that is configured to have a first region 202 and a second region 204 as shown in FIG. 2A. In some embodiments, the first region 202 includes IC features that provide logic devices such as input/output (I/O) devices and logic gates including, for example, AND, OR, NOR, and inverters. The second region 204 includes IC features that provide memory devices such as static random-access memory (SRAM) cells.

Figure 2B:
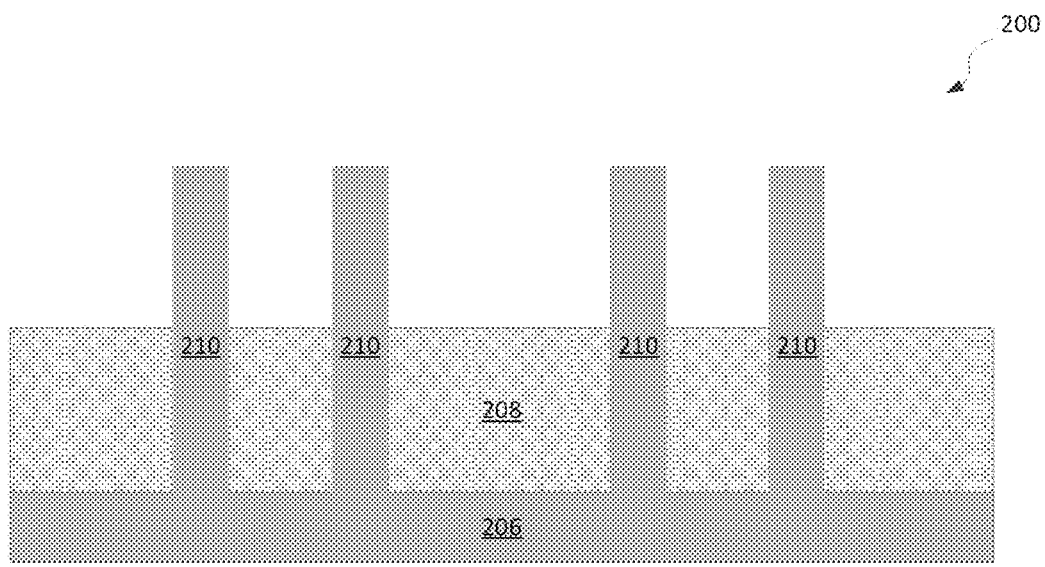
FIGS. 2B, 3B, 4B, 5B, 6B, 7B, and 8B are fragmentary cross-sectional views of the exemplary FinFET device along line BB' as shown in FIGS. 2A, 3A, 4A, 5A, 6A, 7A, and 8A, respectively, and according to various aspects of the present disclosure.
Figure 2C:
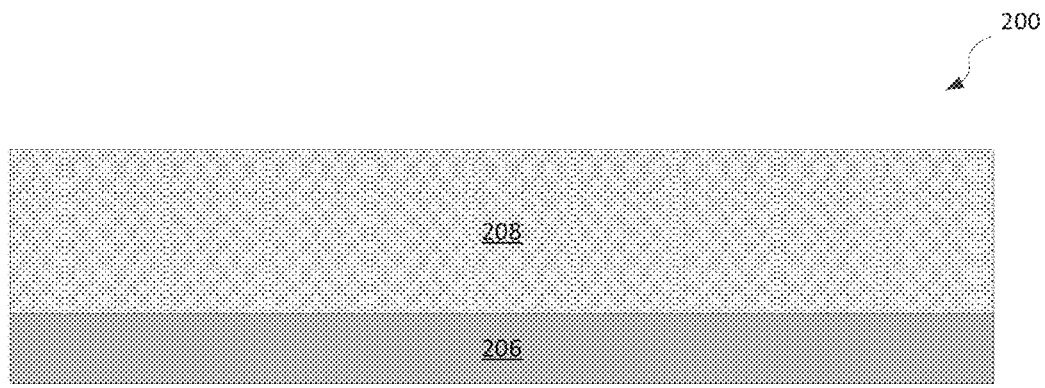
FIGS. 2C, 3C, 4C, 5C, 6C, 7C, 7D, and 8C are fragmentary cross-sectional views of the exemplary FinFET device along line CC' as shown in FIGS. 2A, 3A, 4A, 5A, 6A, 7A, and 8A, respectively, and according to various aspects of the present disclosure.

Referring to FIGS. 2B-2C, the substrate 206 includes a crystalline material that can generally be described to have an ordered atomic structure, or a crystalline structure. In some embodiments, the substrate 206 includes one elementary semiconductor having a crystalline structure, such as silicon. Alternatively or additionally, the substrate 206 includes another elementary semiconductor, such as germanium; a compound semiconductor, such as silicon carbide, gallium arsenide, gallium phosphide, indium phosphide, indium arsenide, and/or indium antimonide; an alloy semiconductor, such as SiGe, GaAsP, AlInAs, AlGaAs, GaInAs, GaInP, and/or GaInAsP; or combinations thereof. Alternatively, the substrate 206 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

Referring to FIG. 1, method 100 proceeds to operation 104 during which fins 210 are formed. As depicted in FIGS. 2A-2B, substantially parallel fins 210 are formed over the substrate 206 and separated by isolation features 208. In some embodiments, forming the fins 210 also leads to the formation of isolation features 208. In some embodiments, the isolation features 208 include, for example, silicon oxide, silicon nitride, silicon oxynitride, fluorine-doped silicate glass (FSG), a low-k dielectric material, other suitable dielectric materials, or combinations thereof. The isolation features 208 can include different structures such as shallow trench isolation (STI) structures, deep trench isolation (DTI) structures, and/or local oxidation of silicon (LOCOS) structures.

The fins 210 and the isolation features 208 can be formed by any suitable process. In an exemplary embodiment, the process can include the following steps: one or more processes for patterning a hard mask layer (not shown) over the substrate 206, an etching process (e.g., a dry etching and/or wet etching process) to etch trenches in the substrate 206 not covered by the patterned hard mask layer, and a deposition process (e.g., a chemical vapor deposition process and/or a spin-on glass process) to fill in the trenches with one or more insulating materials to form the isolation features 208. The trenches may be partially filled, where the substrate remaining between trenches forms the fins 210. The hard mark layer (not shown) may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 206 and patterned using a photolithography process. Spacers are formed alongside the patterned sacrificial layer using a self-aligned process. The sacrificial layer is then removed, and the remaining spacers, or mandrels, become the patterned hard mask layer.

Alternative to partially filling the trenches with the insulating material, operation 104 may completely fill the trenches with the insulating material, planarize a top surface of the filled trenches to remove any excessive insulating material using, for example, a polishing process such as chemical mechanical polishing/planarization (CMP), and selectively grow one or more layers of epitaxial semiconductor materials over the exposed substrate 206 thereby forming the fins 210 with isolation features 208 disposed in between the fins 210. The epitaxial semiconductor material can be, for example, silicon, germanium, silicon germanium, other suitable materials, or combinations thereof. In some embodiments, the filled trenches may have a multi-layer structure such as a thermal oxide liner layer filled with silicon nitride or silicon oxide. Accordingly, the fins 210 formed by embodiments provided herein may comprise the same material as the substrate 206 or, alternatively, they may comprise one or more layers of epitaxially grown semiconductor materials over the substrate 206. In the depicted embodiments, the fins 210 comprise the same material as the substrate 206.

The hard mask layer (not shown) includes any suitable material, for example, silicon oxide, silicon nitride, silicon carbide, silicon oxycarbide, silicon oxynitride, spin-on glass (SOG), a low-k dielectric material, tetraethylorthosilicate (TEOS), plasma-enhanced oxide (PE-oxide), high-aspect-ratio-process (HARP) formed oxide, or other suitable materials, and may be formed by a suitable method, such as thermal oxidation, chemical vapor deposition (CVD), high-density plasma CVD (HDP-CVD), physical vapor deposition (PVD), atomic-layer deposition (ALD), plating, other suitable methods, or a combination thereof. An exemplary etching process can include a dry etching process, a wet etching process, other suitable etching process, or combinations thereof. In some embodiments, a wet etching process implements an etching solution that includes ammonium hydroxide ($NH_4OH$), hydrogen peroxide ($H_2O_2$), sulfuric acid ($H_2SO_4$), tetramethylammonium hydroxide (TMAH), other suitable wet etching solution, or combinations thereof. For example, the wet etching solution can utilize an $NH_4OH:H_2O_2$ solution, an $NH_4OH:H_2O_2:H_2O$ solution (known as an ammonia-peroxide mixture (APM)), or an $H_2SO_4:H_2O_2$ solution (known as a sulfuric peroxide mixture (SPM)). In some embodiments, a dry etching process employs an etchant gas that includes a fluorine-containing etchant gas (e.g., $CF_4$, $SF_6$, $CH_2F_2$, $CHF_3$, and/or $C_2F_6$), an oxygen-containing gas, a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, or combinations thereof. In some embodiments, a reactive ion etching (RIE) process is performed. After the etching process, the patterned hard mask layer is removed from the substrate 206.

Figure 3A:
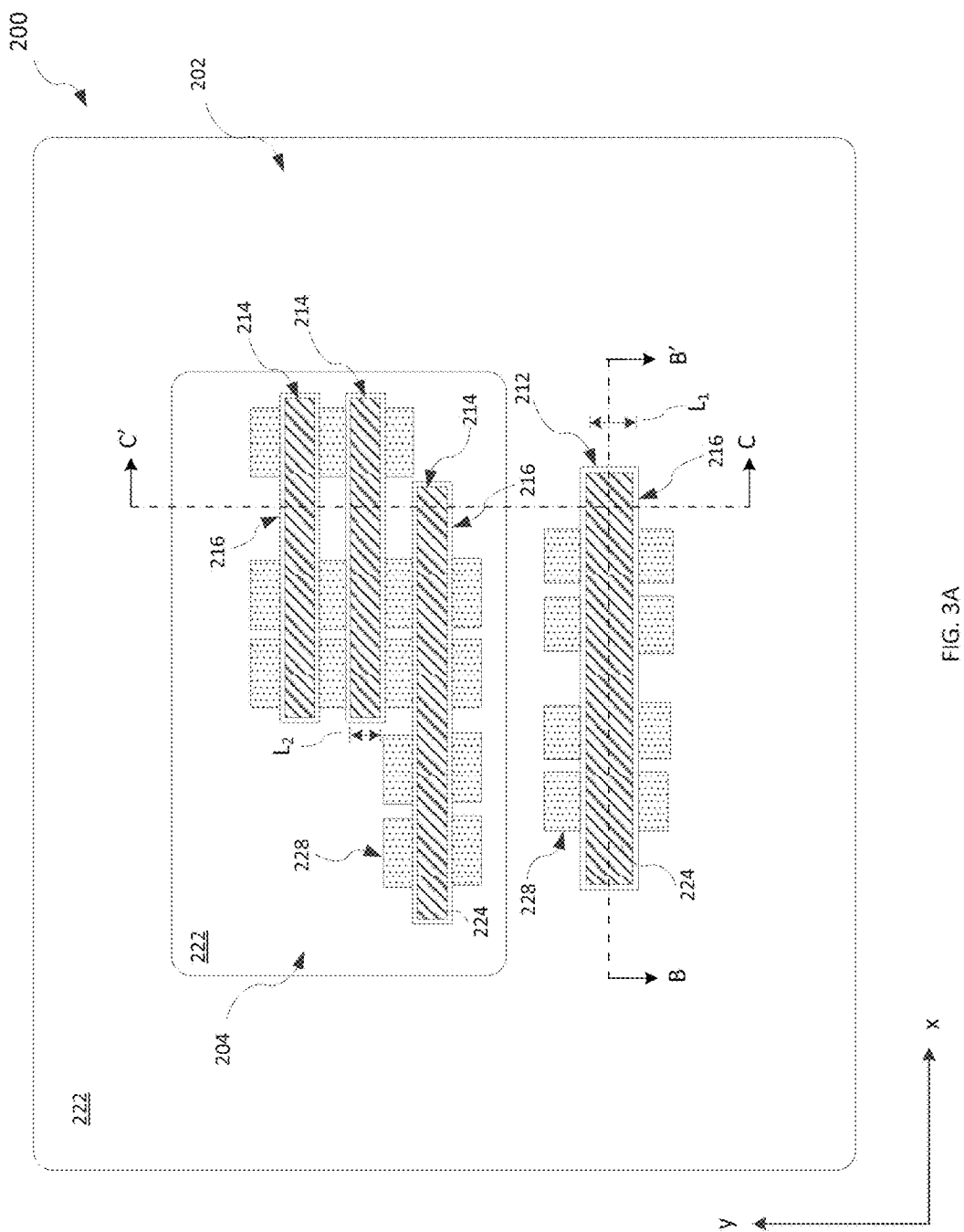
Figure 3B:
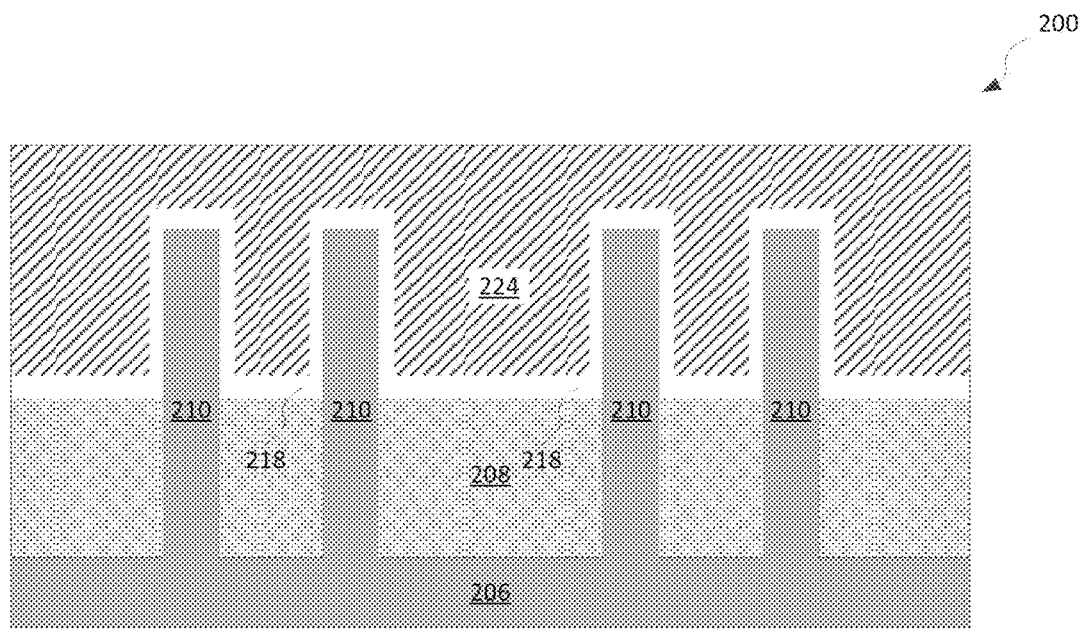
Figure 3C:
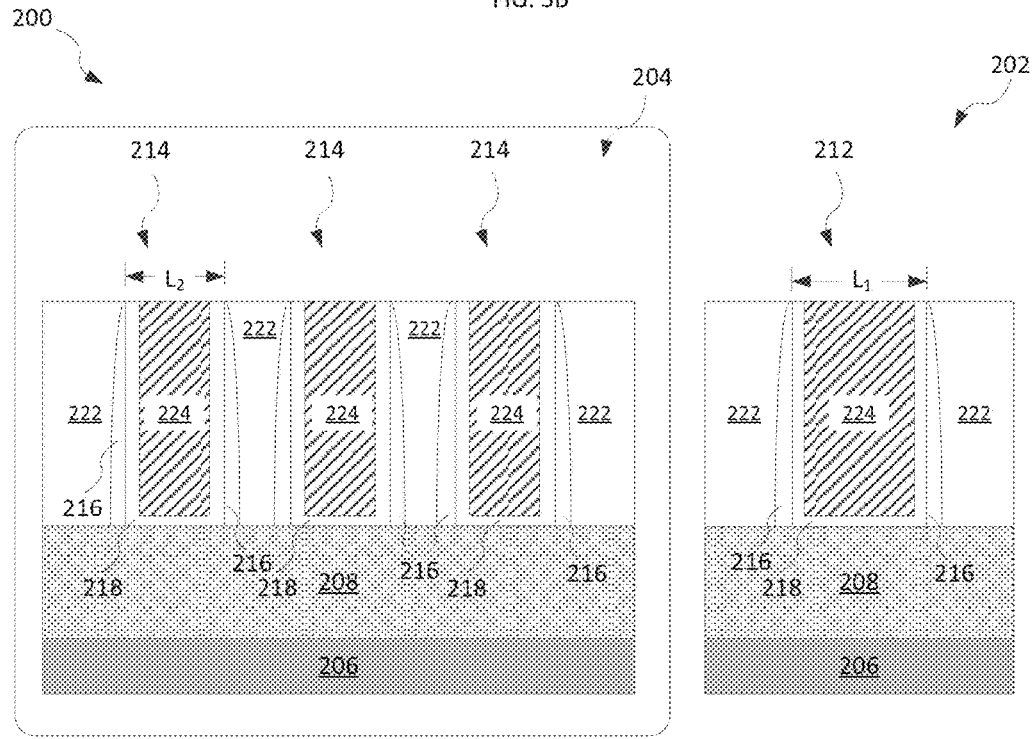
Figure 4A:
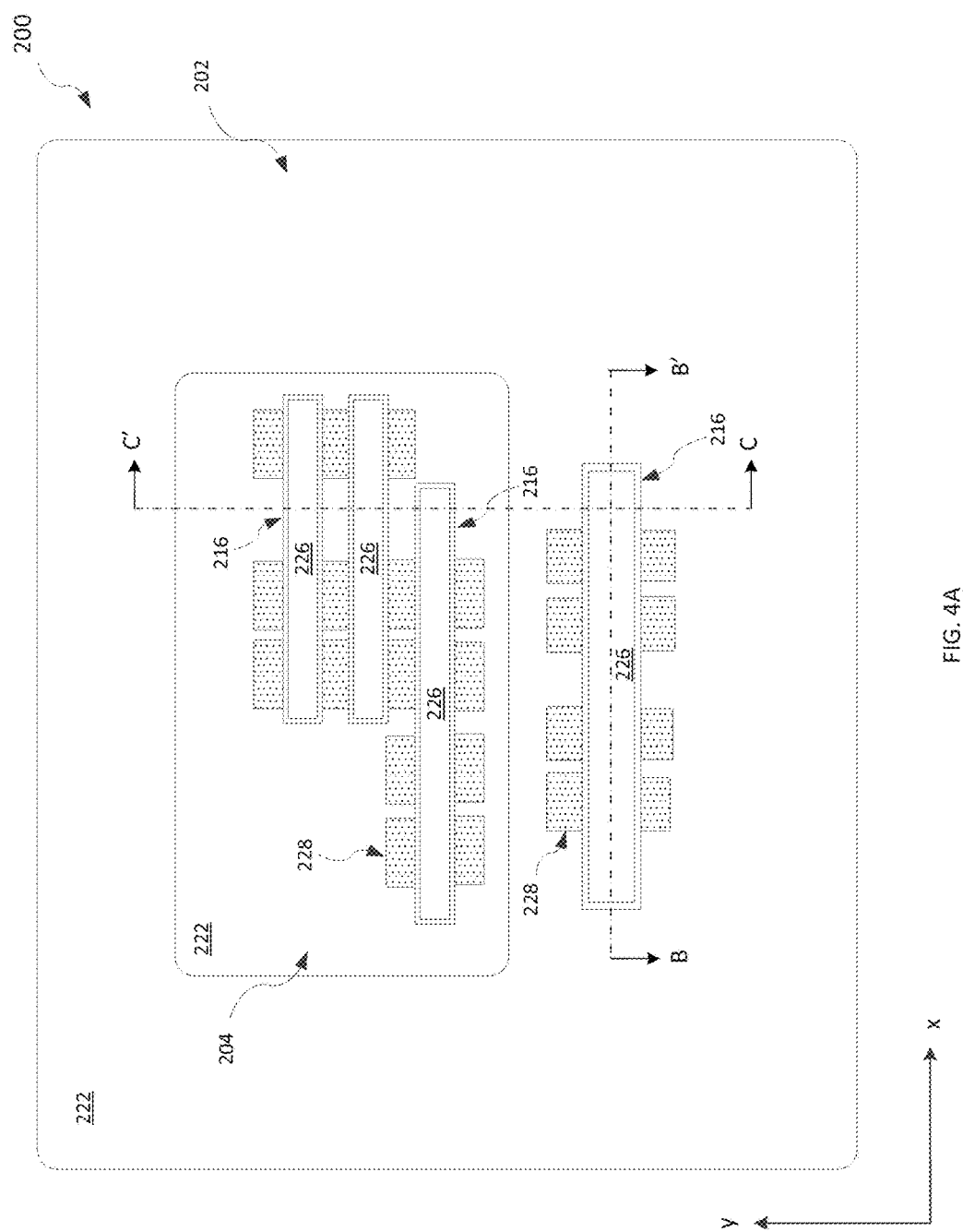
Figure 4B:
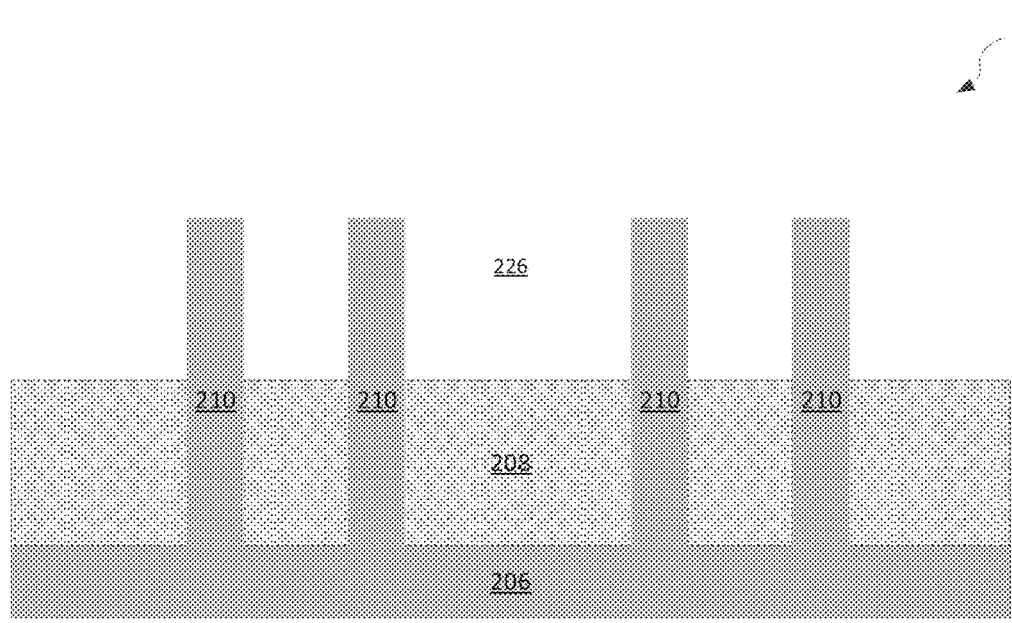
Figure 4C:
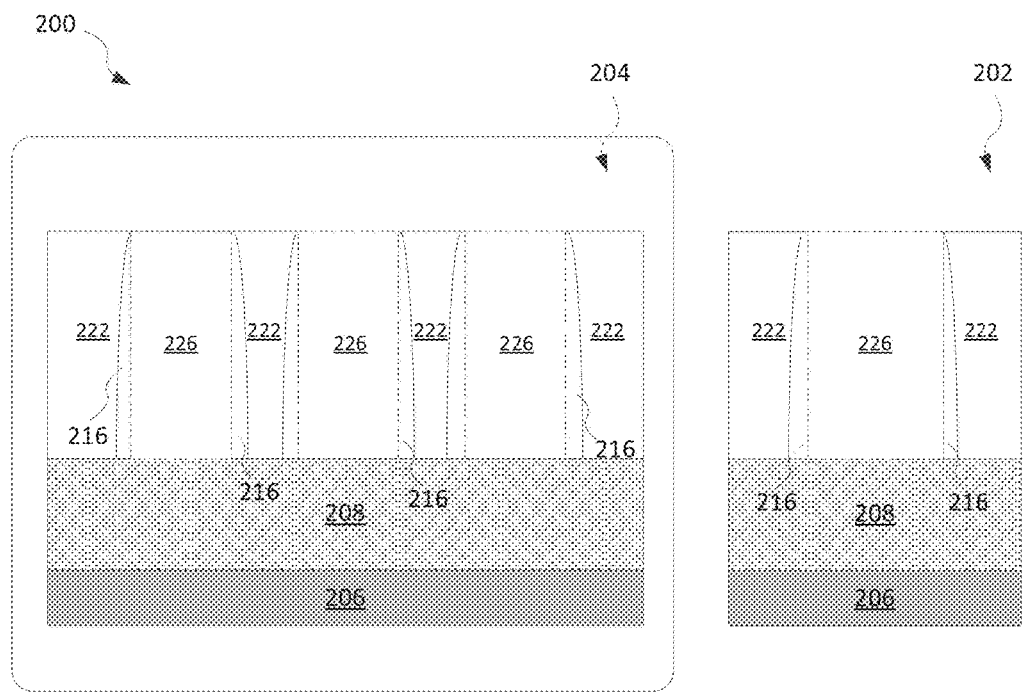

Referring back to FIG. 1, method 100 proceeds to operation 106 during which dummy gate structures are formed over the isolation features 208 and engaging the fins 210 in the first region 202 and the second region 204, respectively. Specifically, as shown in FIGS. 3A-3C, gate structure 212 is formed in the first region 202 and gate structures 214 are formed in the second region 204. Although embodiments of the present disclosure provide one gate structure 212 in the first region 202, it is understood that additional gate structures may be formed in the first region 202 parallel to the depicted gate structure 212. In the depicted embodiment of FIGS. 3A and 3C, the gate length $L_1$ of the gate structure 212 formed in the first region 202 is longer than the gate length $L_2$ of the gate structures 214 formed in the second region 204.

As shown in FIG. 3C, in an embodiment, each dummy gate structure (i.e., 212 and 214) may include a dummy interfacial layer (not shown), a dummy gate dielectric layer 218, and a dummy gate electrode 224 comprising polysilicon. In various embodiments, the dummy gate structures 212 and 214 may include additional layers such as capping layers, diffusion/barrier layers, dielectric layers, conductive layers, other suitable layers, and/or combinations thereof. The dummy gate structures 212 and 214 may be formed by deposition and etching processes.

In some embodiments, a hard mask layer (not shown) may also be formed over the gate electrode 224 by a suitable process to accommodate various fabrication processes during the implementation of method 100. The hard mask layer may include any suitable material such as, for example, silicon nitride, titanium nitride, silicon oxynitride, silicon carbide, silicon oxycarbide, spin-on glass (SOG), a low-k dielectric material, tetraethylorthosilicate (TEOS), plasma enhanced CVD oxide (PE-oxide), high-aspect-ratio-process (HARP) formed oxide, and/or other suitable material.

In some embodiments, gate spacers 216 may be formed on sidewalls of the dummy gate structures 212 and 214. The gate spacers may comprise a dielectric material, such as silicon oxide, silicon nitride, silicon oxynitride, silicon carbide, other dielectric material, or combinations thereof, and my comprise one or multiple layers of material. The gate spacers 216 may be formed by depositing a spacer material as a blanket over the isolation features 208, the fins 210, and the dummy gate structures 212 and 214. Subsequently, the spacer material is etched back anisotropically during an etching process. Portions of the spacer material on the sidewalls of the dummy gate structures 212 and 214 remain and form the gate spacers 216. For clarity purposes, ends of the gate structure 212 (both dummy and the subsequent metal gate structure) including the gate spacer 216 are omitted in FIG. 3B and the subsequent FIGS. 4B, 5B, 6B, 7B, and 8B.

In the depicted embodiments, portions of the dummy gate structures 212 and 214 are subjected to a high-k metal gate (HK MG) replacement process after high thermal budget processes are performed. In some embodiments, the dummy gate electrode 224 is replaced with a plurality of metal layers to form a conductive electrode, while the dummy gate dielectric layer 218 is replaced with a high-k gate dielectric layer 220.

Referring back to FIG. 1, method 100 proceeds to operation 108 during which various features 228 are formed in the source/drain regions (collectively referred to as the source/drain features) of the fins 210 (a top view of the source/drain features 228 is shown in FIG. 3A, 4A, 5A, 6A, 7A, and 8A). In some embodiments, the source/drain features 228 may be raised above the top surface of the fins 210. Operation 108 may be implemented by various fabrication processes. For example, the source/drain features 228 can be formed by first recessing the fins 210 to form a trench. In some embodiments, the recessing process includes an etching process that can selectively etch the fins 210 over other features of the FinFET device 200. The etching process may be a dry etching process, a wet etching process, or combinations thereof. In some embodiments, the recessing process implements an oxidation process. For example, the recessing process can expose the fins 210 to an ozone environment, thereby oxidizing a portion of the fins 210, which is subsequently removed by a cleaning process and/or an etching process, such as those described herein.

Forming the source/drain features 228 further includes forming epitaxial structures over the fins 210 in the source/drain regions of the FinFET device 200. In some embodiments, the epitaxial structure includes one or more epitaxial (EPI) layers. A suitable epitaxial semiconductor material includes, for example, a single element semiconductor material such as germanium (Ge) or silicon (Si); or a compound semiconductor material, such as gallium arsenide (GaAs), aluminum gallium arsenide (AlGaAs); or a semiconductor alloy, such as silicon germanium (SiGe), gallium arsenide phosphide (GaAsP). In some embodiments, the epitaxial structures provided herein may include various dopants according to the type of device desired. For example, where an NMOS FinFET device is desired, the epitaxial structure may include one or more EPI layers of silicon (EPI Si) or silicon carbon, where the silicon or silicon carbon is doped with an n-type dopant such as arsenic, phosphorus, other n-type dopant, or combinations thereof. Alternatively, where a PMOS FinFET device is desired, the epitaxial structure may include one or more EPI layers of silicon germanium (EPI SiGe), where the silicon germanium is doped with a p-type dopant such as boron, indium, other p-type dopant, or combinations thereof. In some embodiments, operation 108 may form the source/drain features 228 for NMOS FinFET and PMOS FinFET devices separately.

In some embodiments, the epitaxial structures provided herein are formed by a suitable deposition process such as, for example, CVD, MO-CVD, other deposition method, or combinations thereof. Any suitable process (e.g., an ion implantation process, a diffusion process, an in-situ doping process, or combinations thereof) can be implemented for doping the epitaxial semiconductor material deposited over the recessed fins 210. In some embodiments, a selective epitaxial growth (SEG) process is performed to grow an EPI layer of semiconductor material on the recessed fins 210, where dopants are introduced into the semiconductor material during the SEG process (e.g., by adding dopants to a source material of the SEG process) forming a doped epi layer. The SEG process can be implemented with CVD deposition techniques (e.g., vapor-phase epitaxy (VPE), ultra-high vacuum CVD (UHV-CVD), LP-CVD, and/or PE-CVD), molecular beam epitaxy, other suitable SEG processes, or combinations thereof. The SEG process can use gaseous precursors (e.g., silicon-containing gases, such as $SiH_4$ and/or germanium-containing gases, such as $GeH_4$) and/or liquid precursors, which interact with a composition of the fins 210 to form EPI Si or EPI SiGe layers. One or more annealing processes may be performed to activate the epitaxial structure. The annealing processes include rapid thermal annealing (RTA) and/or laser annealing processes.

Referring back to FIG. 1, method 100 proceeds to operation 110 during which the dummy gate structures 212 and 214 are replaced with high-k metal gate structures in the first region 202 and the second region 204 to form a device 300. In some embodiments, replacing the dummy gate structures 212 and 214 with HK MG includes a variety of processes. For example, the HK MG replacement process may include depositing a contact etch-stop layer CESL (not shown) over the source/drain features 228, depositing an ILD layer 222 (FIGS. 3A-3C), removing the dummy gate electrode 224 to form trenches 226 in the first region 202 and the second region 204 (FIGS. 4A-4C), and forming high-k metal gate structures 212 and 214 in the trenches 226 to form the device 300 (FIGS. 5A-5C and 6A-6C). These processes are further explained below.

The CESL (not shown) may comprise silicon nitride, silicon oxynitride, silicon nitride with oxygen or carbon elements, and/or other materials, and may be formed by CVD, PVD, ALD, or other suitable methods. The ILD layer 222 is deposited over the isolation features 208 and the CESL, filling space between the dummy gate structures in the first region 202 and the second region 204.

In some embodiment, the ILD layer 222 includes a dielectric material including, for example, TEOS, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 222 can include a multilayer structure having multiple dielectric materials. The ILD layer 222 may be formed by a deposition process such as, for example, CVD, PVD, ALD, HDP-CVD, MO-CVD, RP-CVD, PE-CVD, LP-CVD, AL-CVD, AP-CVD, plating, other suitable methods, or combinations thereof.

Subsequent to the deposition of the ILD layer 222, a planarization process may be performed such that a top portion of the dummy gate electrode 224 is exposed. In some embodiments, the planarization process may be a chemical-mechanical planarization/polishing (CMP) process. Then, a portion of the at least one of the dummy gate structures 212 and 214 is removed, thereby forming the trench (i.e., opening) 226 and exposing any material layers (e.g., an interfacial layer) disposed underneath the dummy gate electrode 224. In some embodiments, forming the trenches 226 includes performing an etching process that selectively removes the dummy gate electrode 224. The etching process may be a dry etching process, a wet etching process, or combinations thereof. A selective etching process can be tuned, such that the dummy gate electrode 224 is subjected to an adequate etch rate relative to the CESL (not shown) and the ILD layer 222.

Figure 5A:
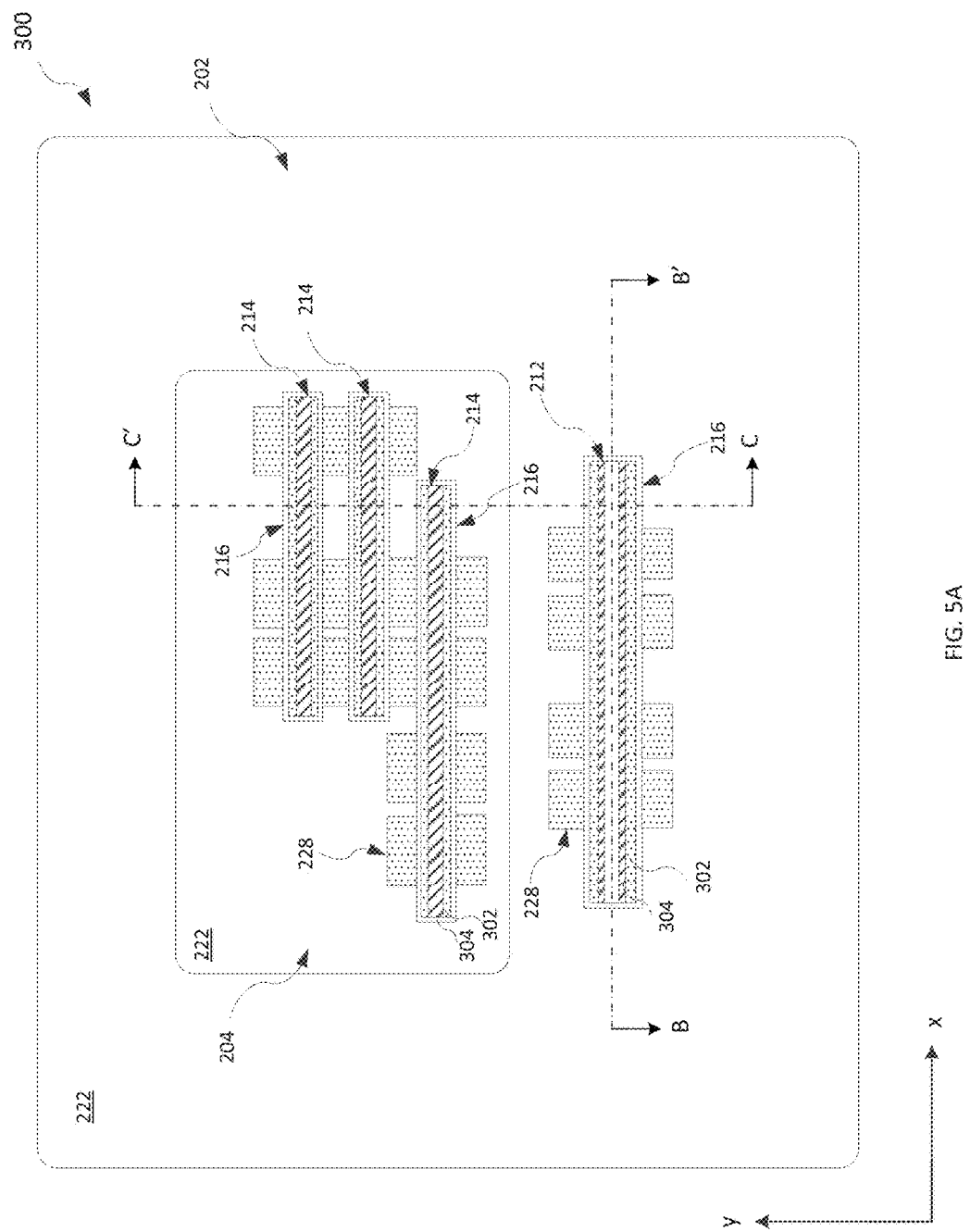
Figure 5B:
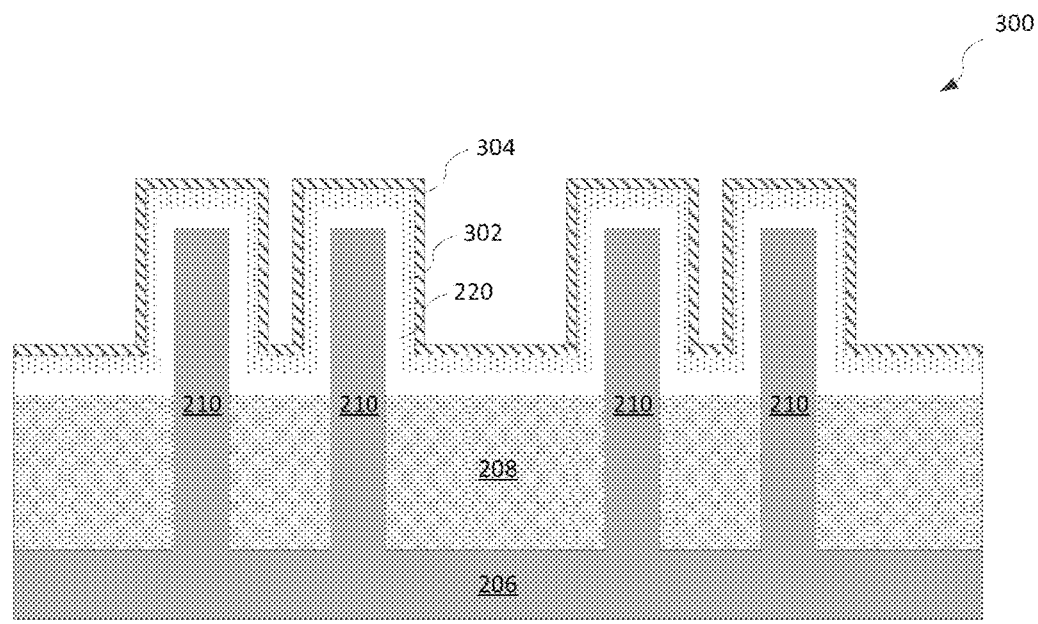
Figure 5C:
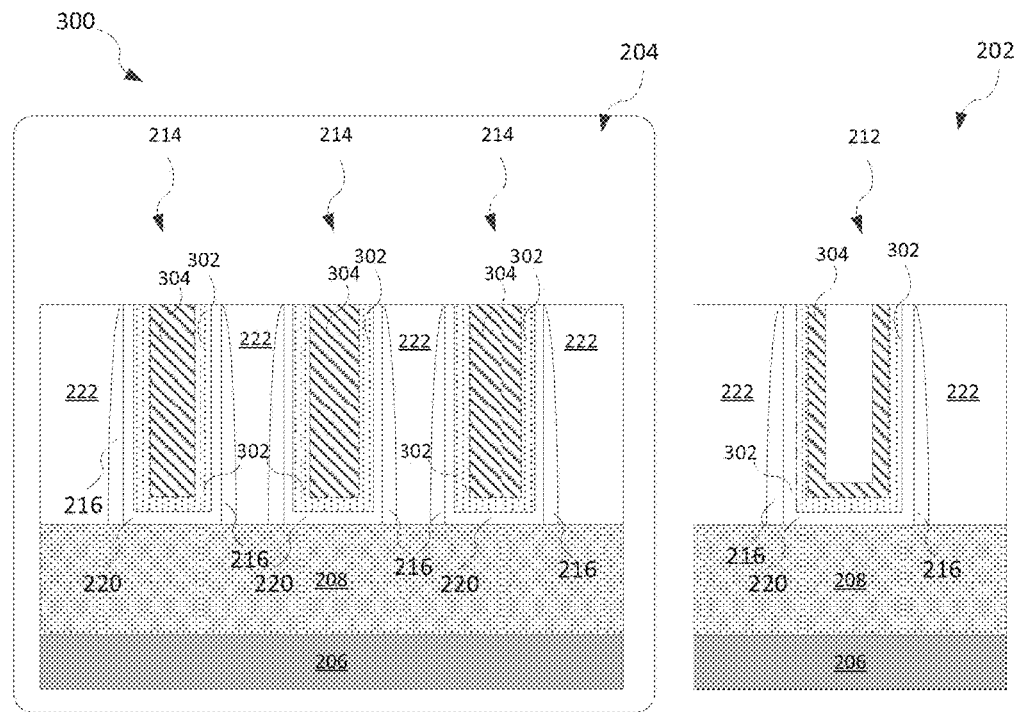
Figure 6A:
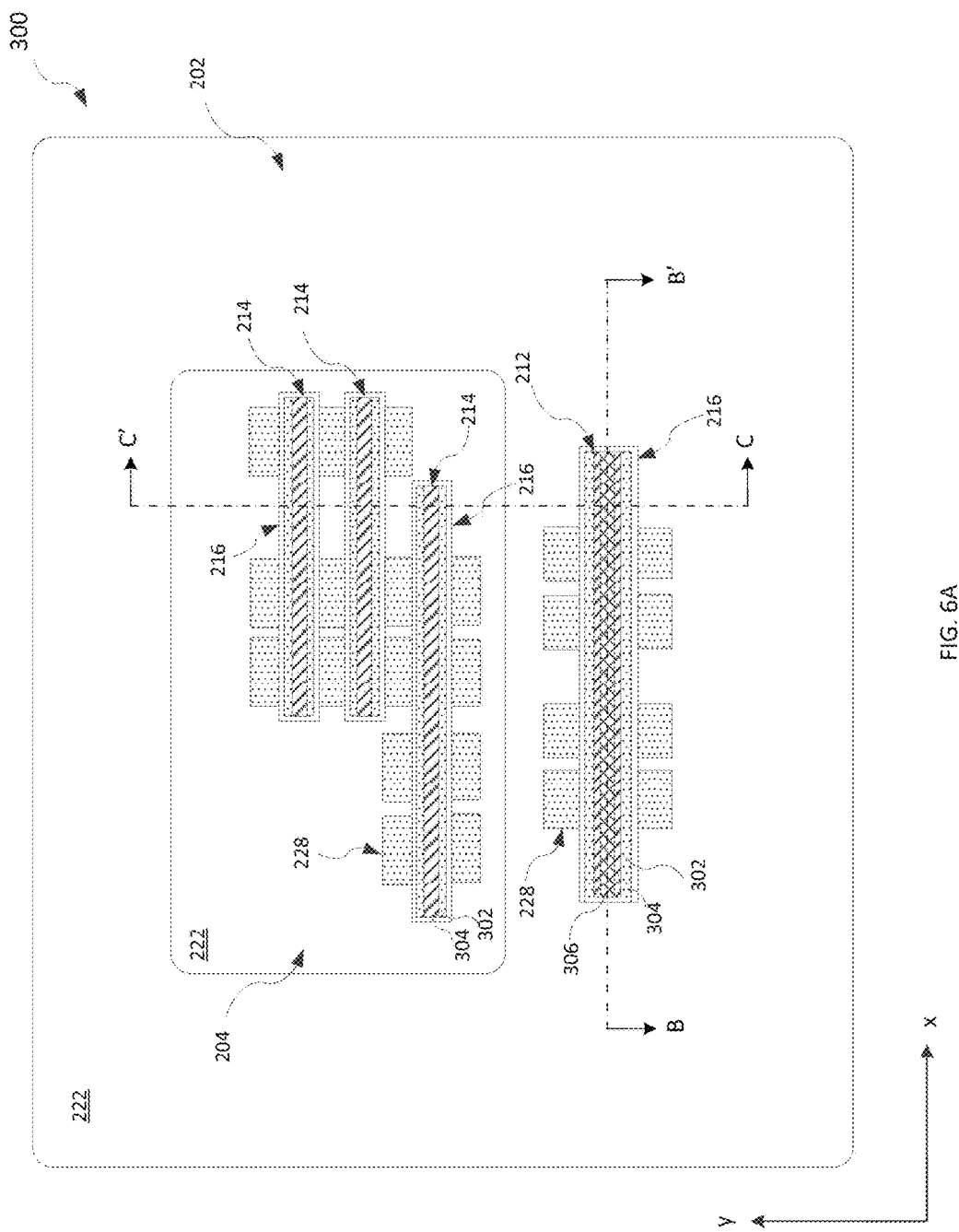
Figure 6B:
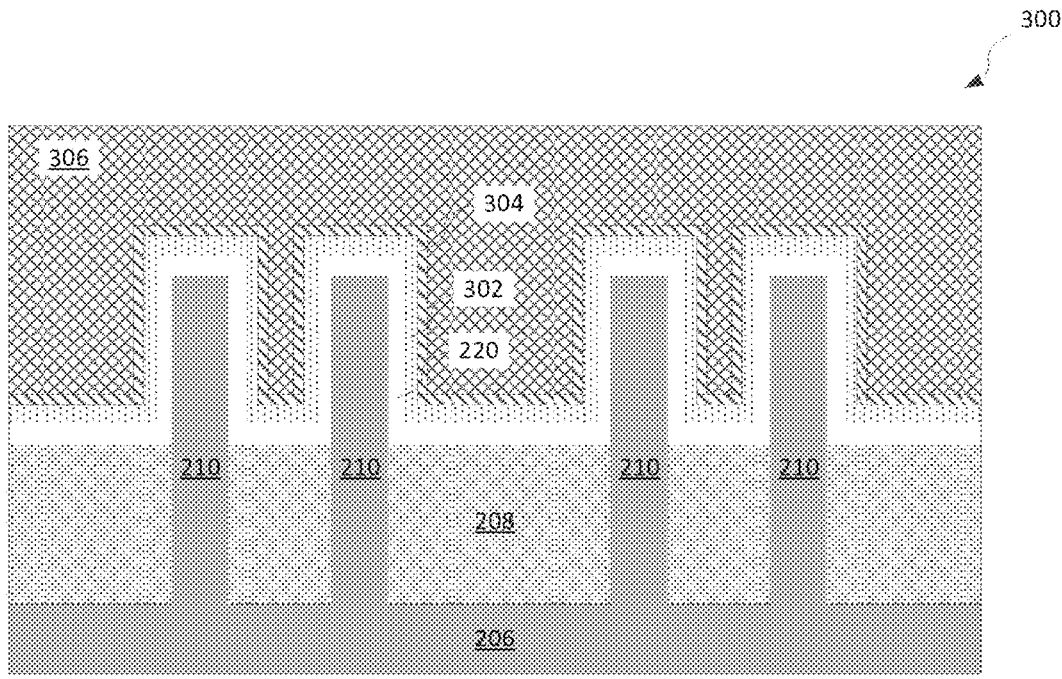
Figure 6C:
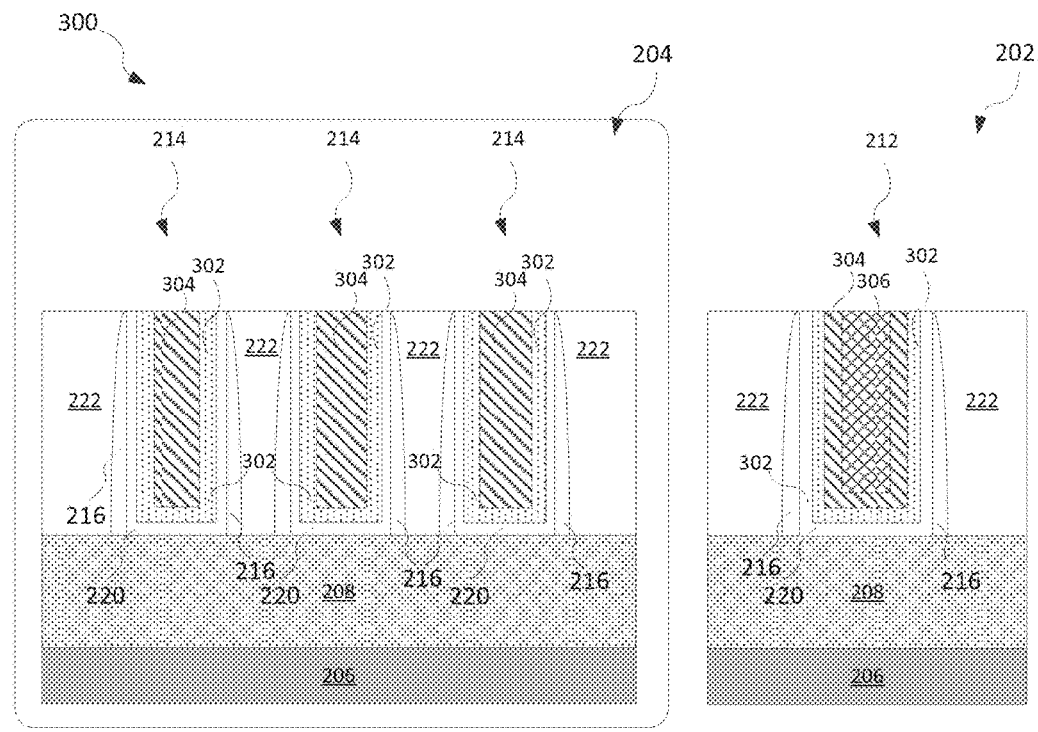

The HK MG replacement process 110 proceeds to forming the high-k metal gate structures 212 and 214 in the first region 202 and the second region 204. FIGS. 5A-5C depict the process for completing the MG replacement of the gate structures 214 in the second region 204 and partially completing the MG replacement of the gate structure 212 in the first region 202. FIGS. 6A-6C depict the process of completing the MG replacement of the gate structure 212 in the first region 202. In various embodiments, the gate structures 212 and 214 may include additional layers such as, for example, capping layers, interface layers, diffusion layers, barrier layers, hard mask layers, or combinations thereof.

In some embodiments, forming the high-k metal gate structures 212 and 214 begins with forming a high-k gate dielectric layer 220 in the trenches 226. Though not depicted herein, some embodiments provide that an interfacial layer may be formed in the trenches 226 prior to depositing the high-k dielectric layer 220. The interfacial layer may be formed using chemical oxidation, thermal oxidation, ALD, CVD, and/or other suitable methods. The high-k gate dielectric layer 220 may include one or more high-k dielectric materials (or one or more layers of high-k dielectric materials), such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The high-k dielectric layer 108 may be deposited using CVD, ALD and/or other suitable methods.

Subsequently, the HK MG replacement process 110 proceeds to forming the gate electrode of metal gate structures 212 and 214, respectively. In the depicted embodiments, forming each gate electrode comprises depositing multiple metal layers (i.e., conductive layers), a process exemplified in FIGS. 5A-5C and 6A-6C.

FIGS. 5A-5C illustrates forming a first metal layer 302 and a second metal layer 304 over the gate dielectric layer 220 in the trenches 226 of the gate structures 212 and 214. In some embodiments, the first metal layer 302 and the second metal layer 304 each includes at least one conductive material such as, for example, polysilicon, Al, Cu, Ti, Ta, W, Pt, Mo, Co, Ag, Mn, Zr, Ru, TaN, NiSi, CoSi, TiN, WN, TiAl, TiAlN, TaCN, TaC, TaSiN, TiAlC, other conductive material, or combinations thereof. In some embodiments, the first metal layer 302 and the second metal layer 304 are work function metal (WFM) layers, which are conductive layers tuned to have a desired work function (e.g., an n-type work function or a p-type work function). In some embodiments, the first metal layer 302 and the second metal layer 304 both include n-type work function materials, such as, for example, Ti, Ag, Mn, Zr, TaAl, TiAlN, TaC, TaCN, TaSiN, other suitable n-type work function materials, or combinations thereof. In other embodiments, the first metal layer 302 and the second metal layer 304 both include p-type work function materials such as, for example, TiN, TaN, Ru, Mo, Al, W, Pt, $ZrSi_2$, $MoSi_2$, $TaSi_2$, $NiSi_2$, WN, other suitable p-type work function materials, or combinations thereof. In some embodiments, the first metal layer 302 and the second metal layer 304 include opposite types of work function materials. For example, the first metal layer 302 includes an n-type work function material, and the second metal layer 304 includes a p-type work function material, or vice versa. As illustrated in FIG. 5A, some of the WFM layers 302 and 304 are disposed over multiple fins 210.

In some embodiments, the gate electrode layer of the gate structures 212 and 214 may include only one WFM layer or, alternatively, three or more WFM layers similar to the first metal layer 302 and the second metal layer 304. Advantageously, threshold voltage of devices provided herein can be tuned by a combination of different WFM layers. In some embodiments, the gate structures 212 and 214 comprise the same type, i.e., n-type or p-type, of WFM layers. In alternative embodiments, the gate structures 212 and 214 comprise different types of WFM layers.

FIGS. 6A-6C illustrates completing the formation of metal gate structures 212 and 214. Specifically, a third metal layer 306 is deposited over the second metal layer 304 to form the gate electrode of the gate structure 212. In some embodiments, the third metal layer 306 is a bulk conductive layer that includes one or more of Al, W, Co, Cu, and may optionally include polysilicon, Ti, Ta, metal alloys, other suitable materials, or combinations thereof. In the depicted embodiments, the third metal layer 306 includes W.

Accordingly, as depicted in FIG. 6C, the gate electrode in the gate structures 214 of the second region 204 includes WFM layers (i.e., the first metal layer 302, the second metal layer 304, and any other additional WFM layers). The gate electrode in the gate structure 212 of the first region 202 includes, in addition to WFM layers similar to or the same as the gate structures 214, a bulk conductive layer (i.e., the third metal layer 306), as shown in FIG. 6C. Though not depicted herein, the gate electrode of the gate structures 214 in the second region may also comprise one or more bulk conductive layers such as the third metal layer 306 provided herein depending upon desired designs of IC devices.

The WFM layers (i.e., the first metal layer 302 and the second metal layer 304), and the bulk conductive layer (i.e., the third metal layer 306) can be formed by various deposition processes such as, for example, CVD, PVD, ALD, plating, other suitable methods, or combinations thereof. A CMP process can be performed to remove excess material (such as any excess work function layers and/or any excess bulk conductive layer), planarizing top surfaces of the gate structures 212 and 214.

Referring back to FIG. 1, method 100 proceeds to operations 112 and 114 during which trenches 410 and 406 are formed in the metal gate structures 212 and 214, respectively, such that the metal gate structures are shortened (or cut) as shown in FIGS. 7A-7D. In the depicted embodiments, the gate structures 212 and 214 are cut simultaneously in a series of patterning and etching processes to form trenches in the metal gate structures. In some embodiments, the cutting process begins with applying hard mask layers 402 and 404 over the metal gate structures 212 and 214. The hard mask layers 402 and 404 may include, for example, silicon oxide, silicon nitride, silicon carbide, silicon oxycarbide, silicon oxynitride, SOG, a low-k dielectric material, TEOS, PE-oxide, HARP formed oxide, or other suitable materials, and may be formed by a suitable method, such as thermal oxidation, CVD, HDP-CVD, PVD, ALD, plating, other suitable methods, or a combination thereof.

Figure 7A:
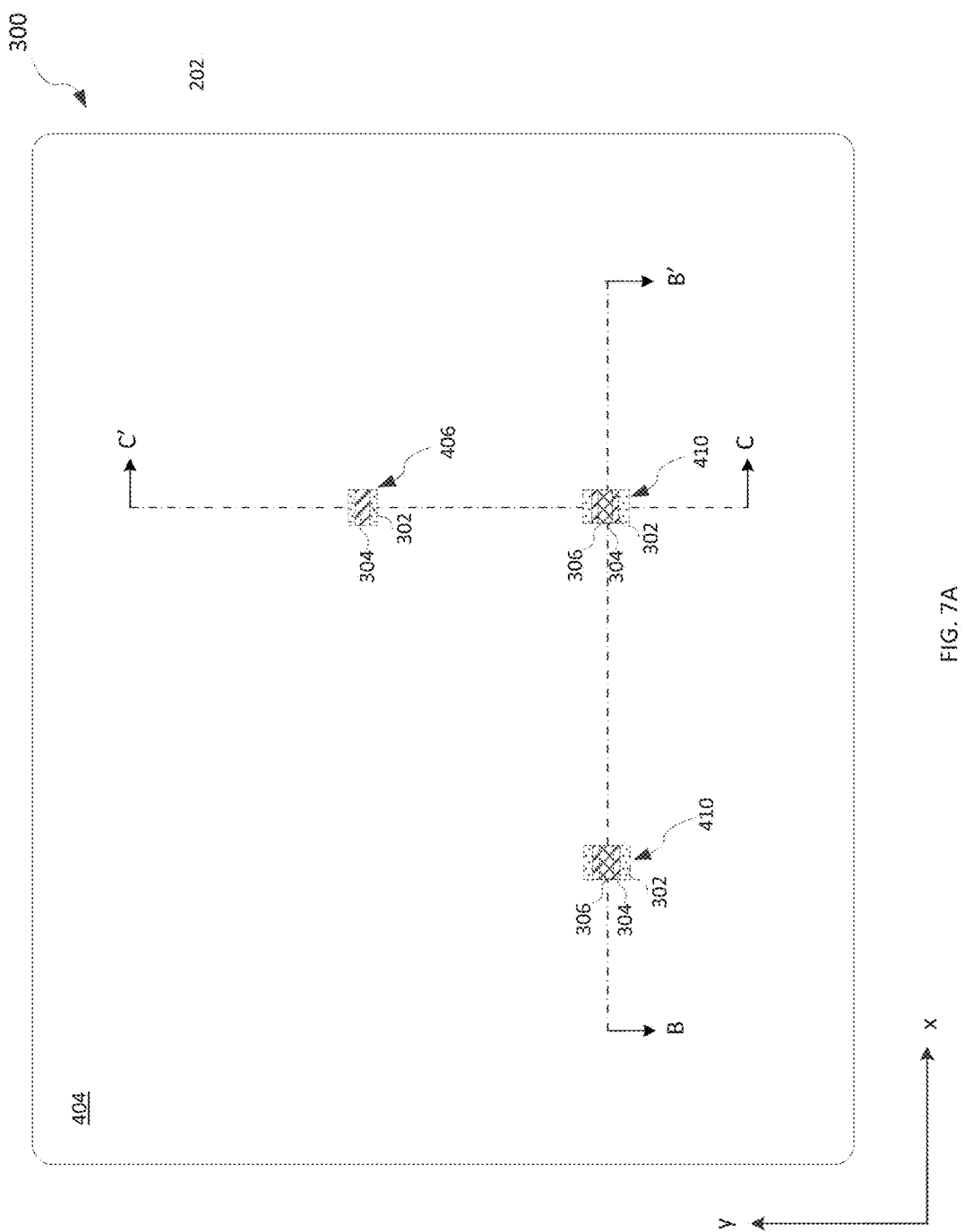
Figure 7B:
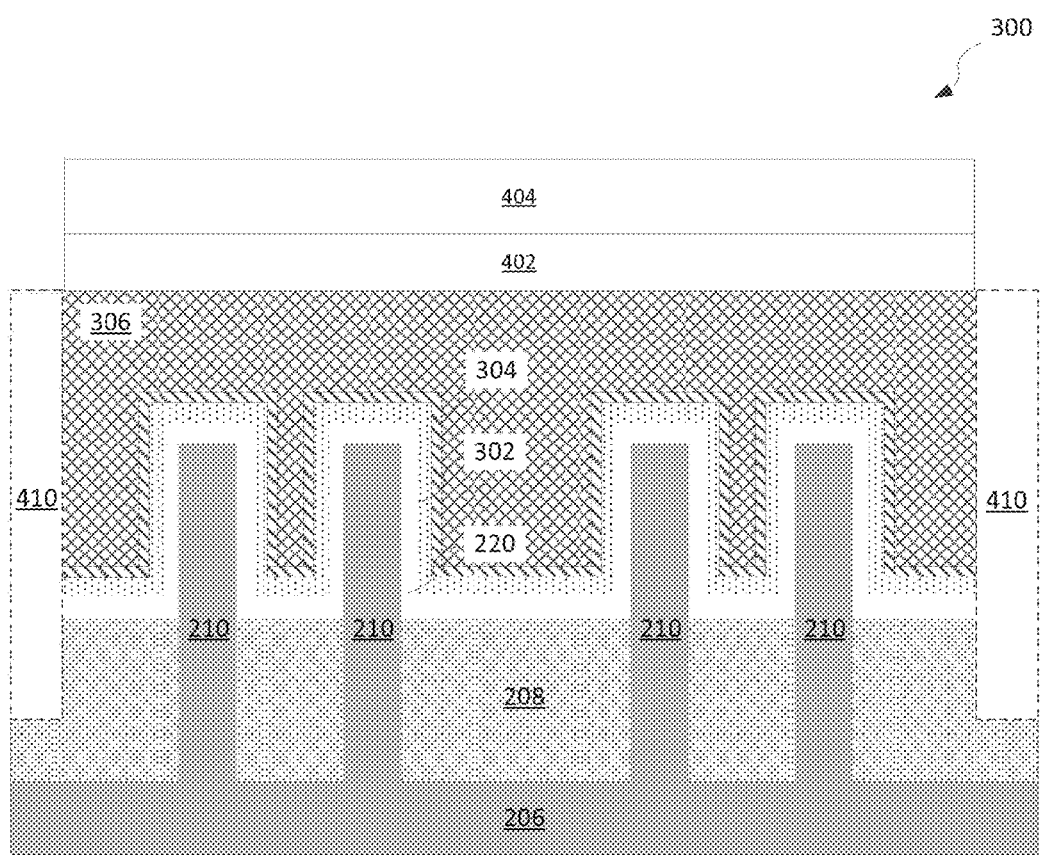
Figure 7C:
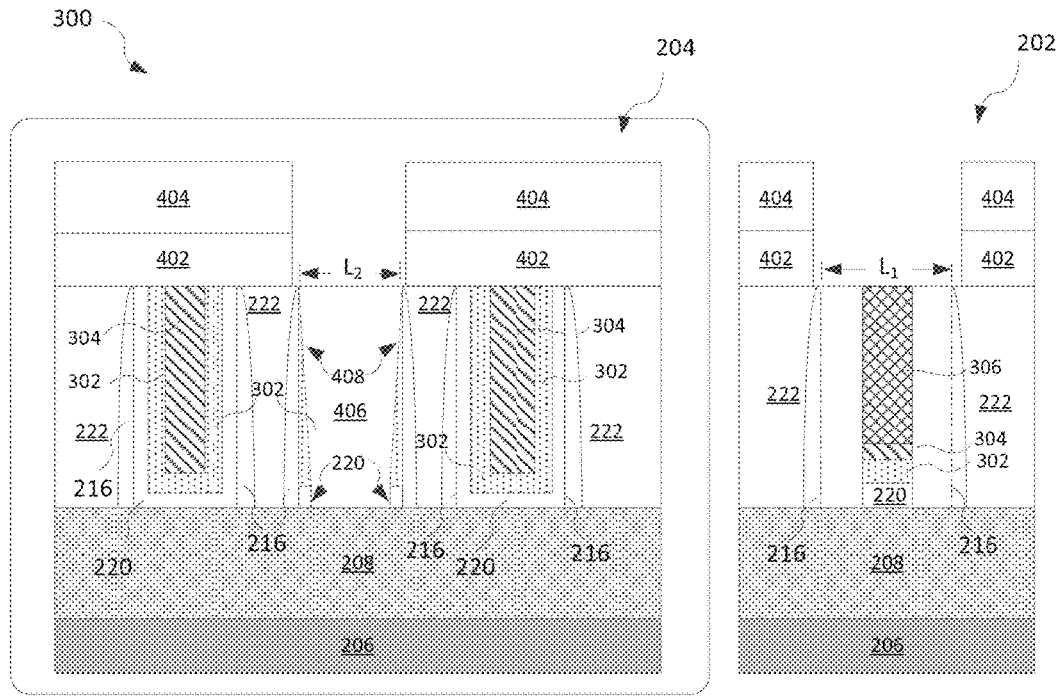
Figure 7D:
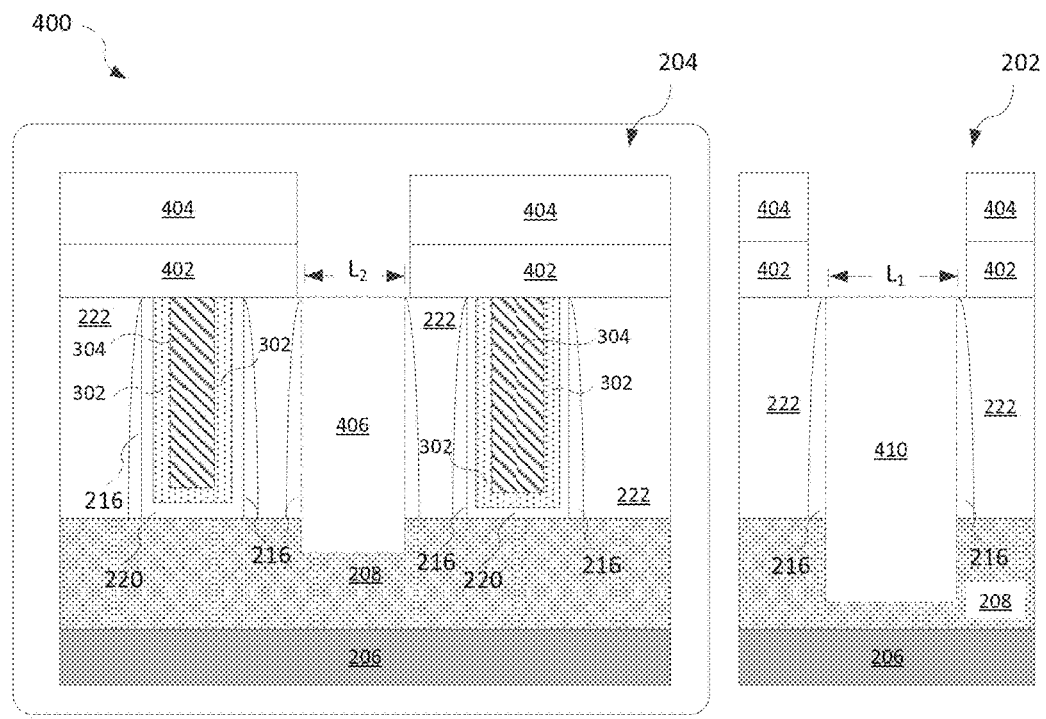

A resist layer (not depicted) is then applied over the hard mask layer 404 and patterned using a series of photolithography processes. The pattern is then transferred to the hard mask layers 402 and 404 as shown in FIGS. 7C-7D. Subsequently, portions of the metal gate structure 212 and 214 exposed by the patterned hard masks 402 and 404 are etched away by two etching processes described below.

In some embodiments, method 100 proceeds to a CMG process that includes a first etching process represented by operation 112 of method 100 as seen in FIG. 1. In the depicted embodiments, the first etching process 112 is implemented by a dry etch process with an applied bias. In some embodiments, the etchant employed for the first etching process 112 comprises a mixture of gases including oxygen and one or more chlorine-based gas. An exemplary embodiment provides that the gas mixture comprises one or more of the following: $Cl_2$, $BCl_3$, $SiCl_4$, $O_2$, and other suitable gases. In some embodiments, the power of applied bias ranges from about 100 W to about 300 W, while the duration of the etching process ranges from about 100 seconds to about 1000 seconds. In the depicted embodiment, the applied bias allows for anisotropic etching of the metal layers along sidewalls of the metal gate structures 212 and 214.

Following the first etching process 112, residual amounts 408 of the WFM layer 302 and the high-k gate dielectric layer 220 remain along sidewalls of the metal gate structure 214 in the trench 406 following the first etching process 112, while no metal layers remain along sidewalls of the metal gate structure 212 (FIG. 7C). This may be a result of aspect ratio dependent etching (ARDE) phenomenon, which generally describes the difference in etching efficiency between features with higher aspect ratio and lower aspect ratio. In the present embodiment, for example, the metal gate structures 214, having the same height as but a shorter gate length $L_2$ than the metal gate structure 212, has a higher aspect ratio than the gate structure 212. As a result, the etching efficiency of the metal gate structure 214 is lower than that of the metal gate structure 212 when cut simultaneously, and it is therefore more difficult to remove the residual metal layer 408 and gate dielectric layer 220 from the bottom corners of the metal gate structure 214 in comparison to the metal gate structure 212. Accordingly, a second etching process 114 is included in the method 100 to complete the CMG process. The second etching process 114 is illustrated in FIG. 7D and discussed in details below.

In some embodiments, the etchant employed for the second etching process comprises a mixture of gases including oxygen and one or more fluorine-based gas. An exemplary embodiment provides that the gas mixture comprises one or more of the following: $CF_4$, $SF_6$, $NF_3$, $O_2$, and other suitable gases. In some embodiments, the duration of the second etching process ranges between about 30 seconds and about 100 seconds. In some embodiments, the power of the applied bias of the second etching process 114 is substantially lower than that of the first etching process 112 and can be, for example, less than about 20 W. In one example, no bias is applied for the second etching process 114 (i.e., the power is 0 W). The substantially lower applied bias for the second etching process 114 is intended for a more isotropic (i.e., in both horizontal and vertical directions), rather than anisotropic, etching effect to remove any remaining portions of the metal layers (e.g., 302, 304, and 306) and the gate dielectric layer 220. Thereafter, the patterned hard mask layers 402 and 404 are removed from the surface of the device 300.

As noted above, the second etching process 114 is implemented using a fluorine-based etchant(s) while the first etching process 112 is implemented using a chlorine-based etchant(s). The reason for this difference is related to the chemical reactivity and etching efficiency of the etchants used with respect to the metal layers to be removed. For example, chlorine-based etchants are much more effective at removing WFM layers 302 and 304 (comprising, for example, titanium and/or tantalum) but reacts with the bulk conductive layer 306 (comprising, for example, tungsten) at a much slower rate. On the other hand, fluorine-based etchants tend to form etching byproducts that may be difficult to remove when reacting with WFM layer metals (e.g., titanium and tantalum), but is much more effective at etching a bulk conductive metal, such as tungsten.

In some embodiments, following the second etching process 114, a bottom surface of each of the trenches 406 and 410 is below a top surface of the isolation features 208. In further embodiments, the bottom surface of the trench 410 is not coplanar with but is lower than the bottom surface of the trench 406, as depicted in FIG. 7D. As described above, the ARDE phenomenon generally leads to a greater etching efficiency for features having a lower aspect ratio. Accordingly, the metal gate structure 212 in the first region 202 is etched to a greater extent than the metal gate structure 214 in the second region 204 when the two gate structures are simultaneously cut, resulting in a deeper cut profile for the metal gate structure 212.

Figure 8A:
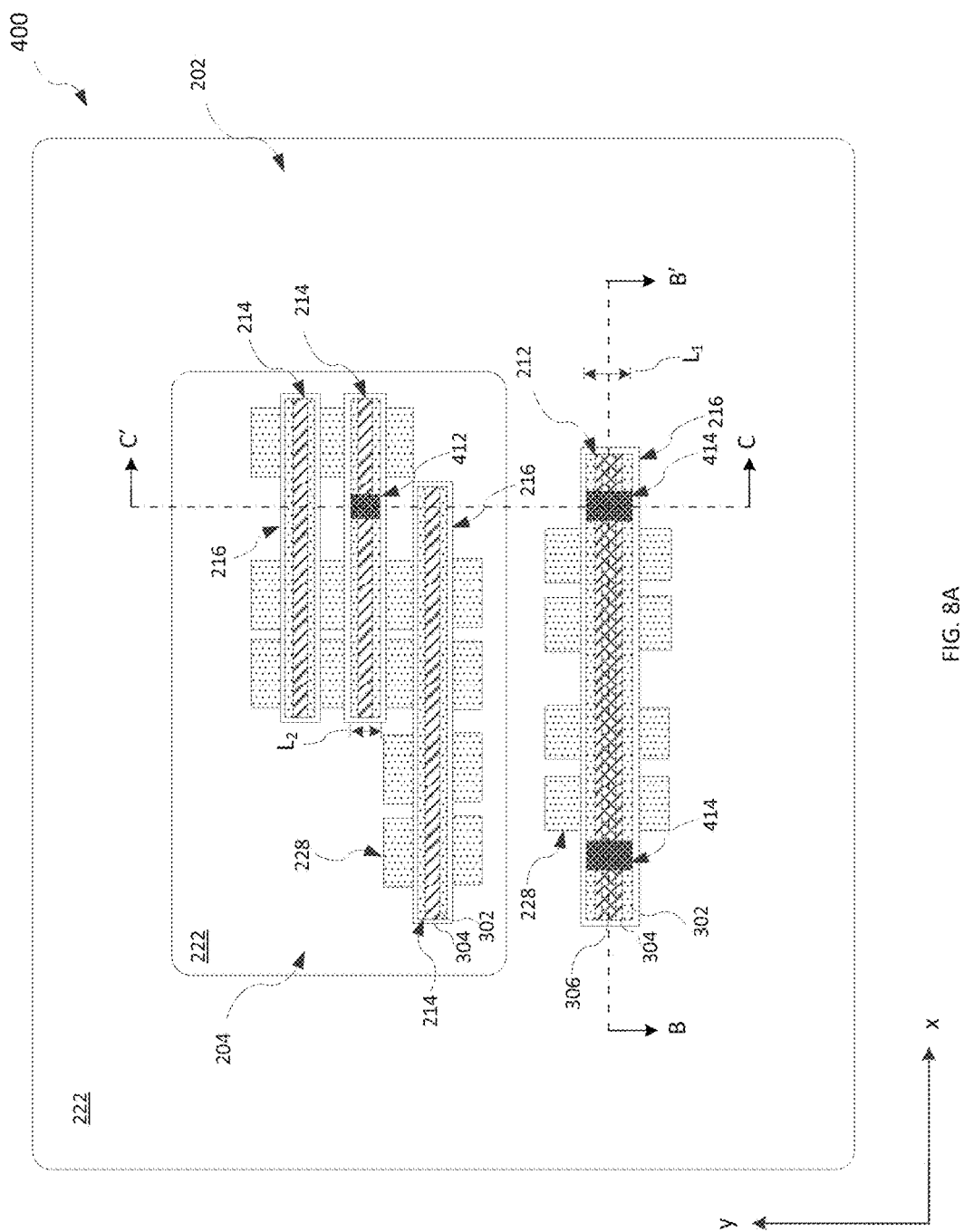
Figure 8B:
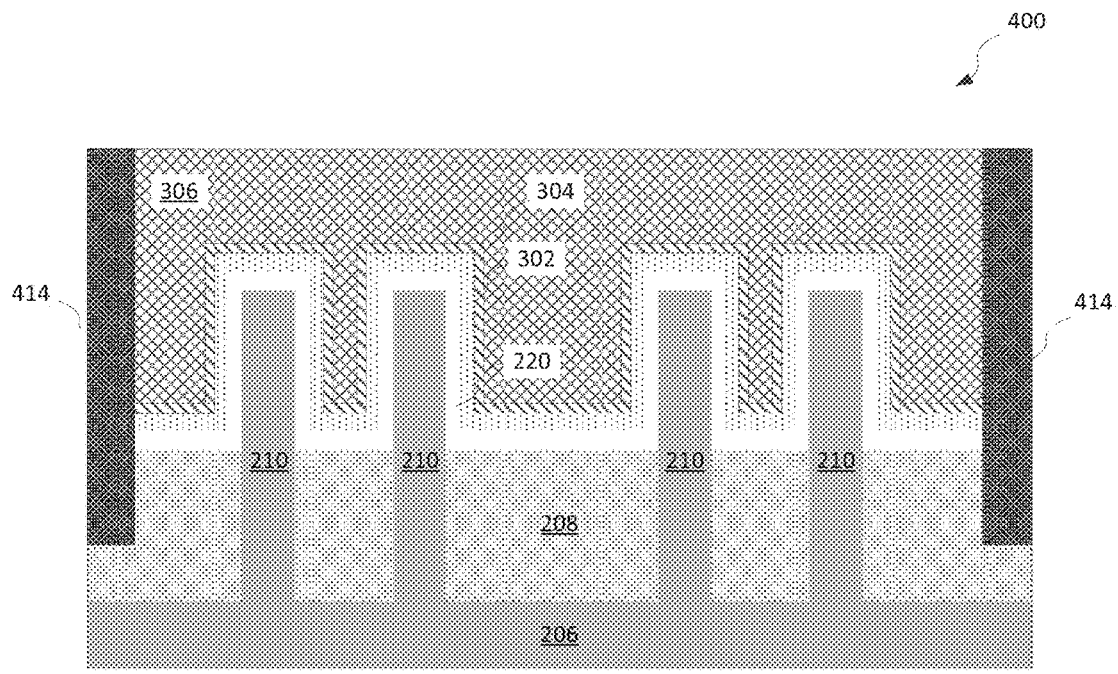
Figure 8C:
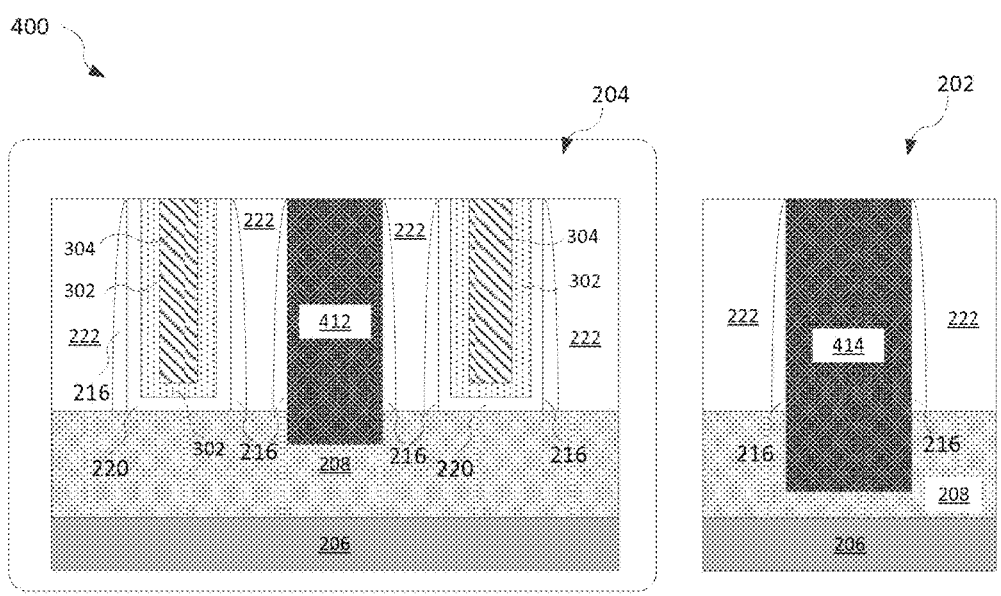

Referring back to FIG. 1 and as shown in FIGS. 8A-8C, method 100 proceeds to completing formation of the device 400 at operation 116 during which an insulating material is deposited in the trenches 406 and 410, respectively, to form gate isolation structures 414 in the first region 202 and at least one gate isolation structure 412 in the second region 204. In some embodiments, the insulating material includes, for example, silicon oxide, silicon nitride, silicon oxynitride, PSG, BPSG, FSG, a low-k dielectric material, other suitable dielectric materials, or combinations thereof. The gate isolation structures 412 can be formed by various deposition processes such as ALD, CVD, PVD, and/or other suitable processes. A subsequent CMP process can be performed to remove any excess insulating material and to planarize the top portions of the gate isolation structures 412 and 414. In some embodiments, as shown in FIGS. 8B and 8C, a bottom surface of the gate isolation structures 414 is below a top surface of the isolation features 208. In some embodiments, a bottom surface of the gate isolation structures 414 in the first region 202 is at a position lower than a bottom surface of the gate isolation structure 412 in the second region 204 as depicted in FIG. 8C.

Accordingly, as a result of the metal gate cutting process exemplified herein, sidewalls of the gate isolation structures 414 in the first region 202 are in direct contact with the bulk conductive layer 306, whereas sidewalls of the gate isolation structure 412 in the second region 204 are in direct contact with one WFM layer (e.g., WFM layer 304) but not the bulk conductive layer 306.

The FinFET device 400 formed in accordance with various embodiments provided herein may be included in a microprocessor, a memory, and/or other integrated circuit device. In some embodiments, the FinFET device 400 may be a portion of an IC chip, a system on chip (SoC), or portion thereof, that includes various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. Additional features can be added to the FinFET device 400 by subsequent processing steps. For example, various vertical interconnect features such as contacts and/or vias, and/or horizontal interconnect features such as lines, and multilayer interconnect features such as metal layers and interlayer dielectrics can be formed over the substrate 206, configured to connect the various features or structures of the FinFET 400. The various interconnect features may implement various conductive materials including aluminum, aluminum alloy (e.g., aluminum/silicon/copper alloy), copper, copper alloy, titanium, titanium nitride, tantalum, tantalum nitride, tungsten, polysilicon, metal silicides, other suitable metals, or combinations thereof. The metal silicides may include nickel silicide, cobalt silicide, tungsten silicide, tantalum silicide, titanium silicide, platinum silicide, erbium silicide, palladium silicide, or combinations thereof.

Although not intended to be limiting, one or more embodiments of the present disclosure offer improvements for semiconductor devices and methods of fabricating the same. For example, embodiments of the present disclosure provide capabilities to simultaneously cut metal gate structures having different gate lengths and compositions in different device regions, thereby consolidating patterning and etching procedures and improving efficiency of the overall fabrication process. Further, various embodiments of the methods provided herein can be readily integrated into existing semiconductor manufacturing processes in which formation of metal gates for memory devices (e.g., SRAM devices) and logic devices is desired.

Accordingly, the present disclosure provides many different embodiments of metal gates in semiconductor devices and methods of fabricating the same. In one aspect, the present disclosure provides a method of fabricating a semiconductor device that includes providing a semiconductor structure that comprises a first region and a second region, the first region including a first metal gate structure formed over multiple first fins and the second region including a second metal gate structure formed over multiple second fins; simultaneously cutting the first metal gate structure to form a first trench and the second metal gate structure to form a second trench, the cutting comprising a first etching process and a second etching process; and depositing an insulating material in the first trench and the second trench to form a first gate isolation structure in the first metal gate structure and a second gate isolation structure in the second metal gate structure, respectively.

In some embodiments, the first metal gate includes one layer more than the second metal gate structure, where the one layer includes a bulk conductive layer. In some embodiments, the first metal gate structure is configured to have a longer gate length than the second metal gate structure. In further embodiments, the first metal gate structure comprises tungsten in the bulk conductive layer.

In some embodiments, the first etching process selectively removes portions of the first and the second metal gate structures that are different from the bulk conductive layer, and the second etching process non-selectively removes remaining portions of the first and the second metal gate structures.

In some embodiments, the first metal gate structure comprises one or more work-function metal layers, and the second metal gate structure comprises one or more work-function metal layers that are the same as or different from those of the first metal gate structure. In further embodiments, the first etching process removes portions of the work-function metal layers in first metal gate structure that are not covered by the bulk conductive layer while simultaneously removing a substantial portion of the work-function metal layers in the second metal gate structure, while the second etching process removes the bulk conductive layer and remaining portions of the work-function metal layers covered by the bulk conductive layer in the first metal gate structure while simultaneously removing remaining portions of the work-function metal layers in the second metal gate structure.

In some embodiments, the first etching process employs a chlorine-based etchant selected from $Cl_2$, $BCl_3$, and $SiCl_4$ with an applied bias in a range of between about 100 W and 300 W. In some embodiments, the second etching process employs a fluorine-based etchant selected from $CF_4$, $SF_6$, and $NF_3$ with an applied bias of less than about 20 W.

In another aspect, the present disclosure provides a method of fabricating a semiconductor device that includes providing a semiconductor structure comprising a first metal gate structure formed over multiple first fins in a first region, the first metal gate structure including a first gate dielectric layer, one or more work-function metal layers, and a bulk conductive layer; removing portions of the work-function metal layers and the first gate dielectric layer not covered by the bulk conductive layer by a first etching process; removing the bulk conductive layer and remaining portions of the work-function metal layers and the first gate dielectric layer by a second etching process to form a first trench in the first metal gate structure; and depositing an insulating material in the first trench to form a first gate isolation structure, sidewalls of which are in direct contact with the bulk conductive layer.

In some embodiments, the first etching process employs a chlorine-based etchant selected from $Cl_2$, $BCl_3$, and $SiCl_4$ with a bias in a range of between about 100 W and about 300 W. In some embodiments, the second etching process employs a fluorine-based etchant selected from $CF_4$, $SF_6$, and $NF_3$ with an applied bias of less than about 20 W.

In some embodiments, the method further includes providing a second metal gate structure formed over multiple second fins in a second region of the semiconductor structure adjacent to the first region, the second metal gate structure comprising a second gate dielectric layer and one or more work-function metal layers but does not comprise the bulk conductive layer; removing a substantial portion of the second gate dielectric layer and one or more work-function metal layers of the second metal gate structure by the first etching process; removing remaining portions of the second metal gate structure by the second etching process to form a second trench in the second metal gate structure; and depositing the insulating material in the second trench to form a second gate isolation structure, the sidewalls of which are in direct contact with a work-function metal layer of the second metal gate structure.

In yet another aspect, the present disclosure provides a semiconductor structure that includes a first region of a semiconductor substrate that comprises a first metal gate structure formed over multiple first fins and a first gate isolation structure, and a second region of the semiconductor substrate comprising a second metal gate structure formed over multiple second fins and a second gate isolation structure. In some embodiments, the first metal gate structure comprises one or more work-function metal layers and a bulk conductive layer. In some embodiments, the second metal gate structure comprises one or more work-function metal layers but does not comprise the bulk conductive layer. In further embodiments, sidewalls of the first gate isolation structure are in direct contact with the bulk conductive layer.

In some embodiments, the first region comprises one or more logic devices and the second region comprises one or more memory devices.

In some embodiments, the first metal gate structure is configured to have a longer gate length than the second metal gate structure.

In some embodiments, the one or more work-function metal layers of the first metal gate structure and of the second metal gate structure are both n-type or both p-type.

In some embodiments, the method further comprises isolation features formed over the semiconductor substrate to separate the first fins and the second fins, such that a bottom surface of the first gate isolation structure is below a top surface of the isolation features. In further embodiments, a bottom surface of the second gate isolation structure is below the top surface of the isolation features but above the bottom surface of the first gate isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a semiconductor structure comprising a first region and a second region, the first region comprising a first metal gate structure formed over a first plurality of fins, the second region comprising a second metal gate structure formed over a second plurality of fins, wherein the first metal gate structure comprises one layer more than the second metal gate structure and the one layer includes a conductive layer;
   simultaneously cutting the first metal gate structure to form a first trench and the second metal gate structure to form a second trench, the cutting comprising a first etching process and a second etching process, wherein the first etching process selectively removes portions of the first and the second metal gate structures that are different from the conductive layer, and wherein the second etching process removes remaining portions of the first and the second metal gate structures; and
   depositing an insulating material in the first trench and the second trench to form a first gate isolation structure in the first metal gate structure and a second gate isolation structure in the second metal gate structure, respectively.

2. The method of claim 1, wherein the first metal gate structure comprises one or more work-function metal layers, and wherein the second metal gate structure comprises one or more work-function metal layers that are the same as or different from those of the first metal gate structure.

3. The method of claim 2, wherein the first etching process removes portions of the work-function metal layers in the first metal gate structure that are not covered by the conductive layer while simultaneously removing a substantial portion of the work-function metal layers in the second metal gate structure.

4. The method of claim 3, wherein the second etching process removes the conductive layer and remaining portions of the work-function metal layers covered by the conductive layer in the first metal gate structure while simultaneously removing remaining portions of the work-function metal layers in the second metal gate structure.

5. The method of claim 1, wherein the first etching process employs a chlorine-based etchant selected from $Cl_2$, $BCl_3$, and $SiCl_4$.

6. The method of claim 5, wherein the first etching process employs an applied bias in a range of between about 100 W and about 300 W.

7. The method of claim 1, wherein the second etching process employs a fluorine-based etchant selected from $CF_4$, $SF_6$, and $NF_3$.

8. The method of claim 7, wherein the second etching process employs an applied bias of less than about 20 W.

9. The method of claim 1, wherein the first metal gate structure is configured to have a longer gate length than the second metal gate structure.

10. The method of claim 9, wherein the first metal gate structure comprises tungsten in the conductive layer.

11. A method, comprising:
    providing a semiconductor structure comprising a first metal gate structure formed over a first plurality of fins in a first region, wherein the first metal gate structure comprises a first gate dielectric layer, one or more work-function metal layers, and a conductive layer;
    removing portions of the work-function metal layers and the first gate dielectric layer not covered by the conductive layer by a first etching process;
    removing the conductive layer and remaining portions of the work-function metal layers and the first gate dielectric layer by a second etching process to form a first trench in the first metal gate structure;
    depositing an insulating material in the first trench to form a first gate isolation structure, wherein sidewalls of the first gate isolation structure are in direct contact with the conductive layer;

providing a second metal gate structure formed over a second plurality of fins in a second region of the semiconductor structure, wherein the second metal gate structure comprises a second gate dielectric layer and one or more work-function metal layers but does not comprise the conductive layer;

removing a substantial portion of the second gate dielectric layer and one or more work-function metal layers of the second metal gate structure by the first etching process;

removing remaining portions of the second metal gate structure by the second etching process to form a second trench in the second metal gate structure; and depositing the insulating material in the second trench to form a second gate isolation structure, wherein sidewalls of the second gate isolation structure are in direct contact with a work-function metal layer of the second metal gate structure.

12. The method of claim 11, wherein the first etching process employs a chlorine-based etchant selected from $Cl_2$, $BCl_3$, and $SiCl_4$, and an applied bias in a range of between about 100 W and about 300 W.

13. The method of claim 11, wherein the second etching process employs a fluorine-based etchant selected from $CF_4$, $SF_6$, and $NF_3$, and an applied bias of less than about 20 W.

14. A method, comprising:

providing a semiconductor structure comprising a first region and a second region, the first region comprising a first metal gate structure disposed over an isolation region and a first plurality of fins, the second region comprising a second metal gate structure disposed over the isolation region and a second plurality of fins, wherein the first metal gate structure includes a conductive layer and the second metal gate structure is free of the conductive layer;

performing a first etching process to portions of the first metal gate structure and the second metal gate structure disposed over the isolation region to form a first trench and a second trench, respectively, wherein the performing of the first etching process removes portions of the first metal gate structure not covered by the conductive layer in the first trench;

after the performing of the first etching process, performing a second etching process to remove remaining portions of the first metal gate structure and the second metal gate structure in the first trench and the second trench, respectively; and forming a first gate isolation structure and a second gate isolation structure in the first trench and the second trench, respectively.

15. The method of claim 14, wherein the performing of the first etching process removes portions of a first gate dielectric layer and a first work-function metal layer included in the first metal gate structure as well as substantial portions of a second gate dielectric layer and a second work-function metal layer included in the second metal gate structure.

16. The method of claim 14, wherein the first etching process and the second etching process employ different etchants.

17. The method of claim 16, wherein the first etching process employs a chlorine-based etchant selected from $Cl_2$, $BCl_3$, and $SiCl_4$.

18. The method of claim 14, wherein a gate length of the first metal gate structure is greater than a gate length of the second metal gate structure.

19. The method of claim 14, wherein the performing of the second etching process removes a portion of the isolation region in the first trench and the second trench, respectively.

* * * * *